(12) United States Patent
Jung

(10) Patent No.: US 7,527,986 B1
(45) Date of Patent: May 5, 2009

(54) METHOD FOR FABRICATING MAGNETIC TUNNEL JUNCTION CELL

(75) Inventor: Jin-Ki Jung, Ichon (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 12/165,368

(22) Filed: Jun. 30, 2008

(30) Foreign Application Priority Data

Dec. 21, 2007 (KR) .................. 10-2007-0135010

(51) Int. Cl.
*H01L 21/00* (2006.01)
(52) U.S. Cl. .................. 438/3; 438/48; 438/59; 438/85; 438/131; 438/197; 257/E21.665
(58) Field of Classification Search .................. None
See application file for complete search history.

(56) References Cited

U.S. PATENT DOCUMENTS 6,689,622 B1 * 2/2004 Drewes .................. 438/3

* cited by examiner

*Primary Examiner*—N Drew Richards
*Assistant Examiner*—Kyoung Lee
(74) *Attorney, Agent, or Firm*—Townsend and Townsend and Crew LLP

(57) ABSTRACT

A method for fabricating a magnetic tunnel junction cell comprises forming an insulation layer with an opening, forming a first pattern including multiple layers of a first electrode pattern on a bottom surface and a sidewall of the opening and an anti-ferromagnetic pattern over the first electrode pattern, forming a magnetic tunnel junction layer over the first pattern and the insulation layer, forming a second electrode having a line width greater than the width of the opening, over the magnetic tunnel junction layer, and etching the magnetic tunnel junction layer using the second electrode as an etch barrier.

13 Claims, 6 Drawing Sheets

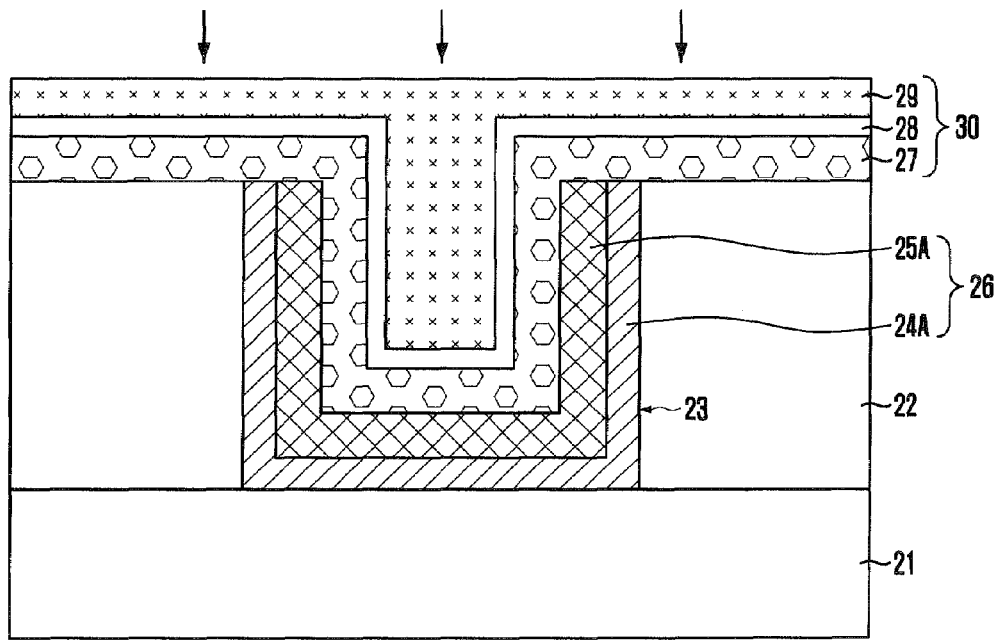
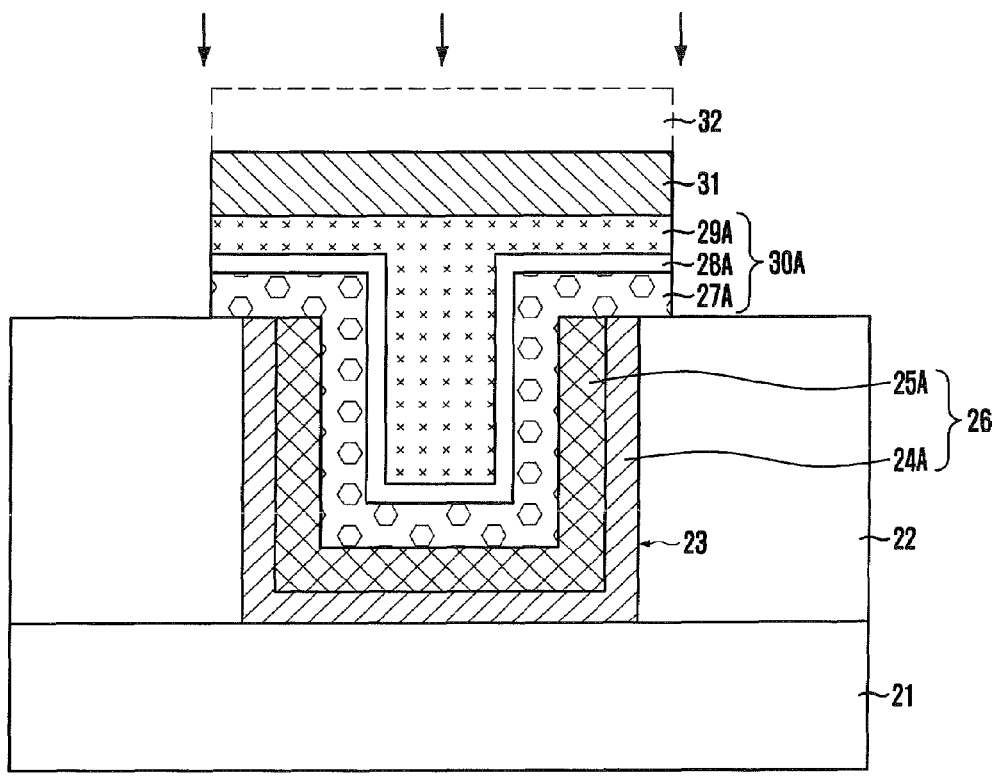

METHOD FOR FABRICATING MAGNETIC TUNNEL JUNCTION CELL

CROSS-REFERENCE TO RELATED APPLICATIONS

The present invention claims priority of Korean patent application number 2007-0135010, filed on Dec. 21, 2007, which is incorporated by reference in its entirety.

BACKGROUND OF THE INVENTION

The present invention relates to a method for fabricating a semiconductor device, and more particularly, to a method for fabricating a magnetic tunnel junction (MTJ) cell.

Recently, as semiconductor devices become highly integrated, a magnetic random access memory (MRAM) has attracted a good deal of attention as a next generation high performance non-volatile semiconductor memory device. The MRAM includes a transistor performing a switching operation, and an MTJ cell for storing data. The MTJ cell includes a magnetic tunnel junction unit including an insulation layer between two ferromagnetic layers. The electric resistance of the MTJ cell is changed according to the magnetization direction of the two ferromagnetic layers. Using voltage change or current change according to the resistance change, it can be determined which logic level (i.e., "1" or "0") the data stored in the MTJ cell has.

FIG. 1 illustrates a cross-sectional view of a typical MTJ cell on which an etch byproduct is deposited. FIG. 2 illustrates a micrographic view of a typical MTJ cell on which an etch byproduct is deposited.

Referring to FIGS. 1 and 2, an anti-ferromagnetic layer 12, a first ferromagnetic layer 13, an insulation layer 14, and a second ferromagnetic layer 15 are sequentially formed over a first electrode 11. The anti-ferromagnetic layer 12, the first ferromagnetic layer 13, and the second ferromagnetic layer 15 are formed of metal compounds.

Then, a second electrode 16 is formed over the second ferromagnetic layer 15. Using the second electrode 16 as an etch barrier, the second ferromagnetic layer 15, the insulation layer 14, the first ferromagnetic layer 13 and the anti-ferromagnetic layer 12 are sequentially etched to form an MTJ cell. Here, the second ferromagnetic layer 15 and the first ferromagnetic layer 13 are separated electrically by the insulation layer 14 so that the MTJ cell operates normally.

However, the typical method for fabricating the MTJ cell may produce a conductive etch byproduct during etching, as represented by circle "A" in FIGS. 1 and 2, thereby deteriorating electric property of the MTJ cell. The metal compounds constituting the anti-ferromagnetic layer 12, the first ferromagnetic layer 13 and the second ferromagnetic layer 15 have high boiling points. Accordingly, the conductive etch byproduct 18 produced during the etching of the metal compounds is evaporated, but then redeposited on the side wall of the MTJ cell. The conductive etch byproduct 18 redeposited on a sidewall of an MTJ unit 17 can short the first ferromagnetic layer 13 and the second ferromagnetic layer 15, deteriorating the electric property of the MTJ cell. This may cause a fail in a semiconductor device, such as an MRAM, to which the MTJ cell is applied, decreasing reliability and FABRIC yield of the semiconductor device. The conductive etch byproduct 18 deposited on the sidewall of the MTJ unit 17 is produced during the etching of the anti-ferromagnetic layer 12. Accordingly, there is a need for a method for preventing the deterioration of the electric property of the MTJ cell caused by the conductive etch byproduct 18 produced during the etching of the anti-ferromagnetic layer 12.

SUMMARY OF THE INVENTION

Embodiments of the present invention relate to a method for fabricating an MTJ cell, capable of preventing deterioration of electric property of the MTJ cell due to a conductive etch byproduct produced during etching.

In accordance with an aspect of the present invention, there is provided a method for fabricating a magnetic tunnel junction cell. The method comprises forming an insulation layer with an opening, forming a first pattern including multiple layers of a first electrode pattern on a bottom surface and a sidewall of the opening and an anti-ferromagnetic pattern over the first electrode pattern, forming a magnetic tunnel junction layer over the first pattern and the insulation layer, forming a second electrode having a line width greater than the width of the opening, over the magnetic tunnel junction layer, and etching the magnetic tunnel junction layer using the second electrode as an etch barrier.

BRIEF DESCRIPTION OF THE DRAWINGS

FIGS. 3A to 3F illustrate a method for fabricating an MTJ cell in accordance with a first embodiment of the present invention.

DESCRIPTION OF SPECIFIC EMBODIMENTS

The method can prevent a short between a first ferromagnetic layer and a second ferromagnetic layer due to redeposition onto a sidewall of a MTJ unit of a conductive etch byproduct produced during etching, especially during etching of an anti-ferromagnetic layer.

A method for fabricating an MTJ cell in accordance with a first embodiment of the present invention will be described below. The first embodiment is primarily focused on etching the anti-ferromagnetic layer to a predetermined anti-ferromagnetic pattern before forming an MTJ layer including a first ferromagnetic layer, an insulation layer and a second ferromagnetic layer.

FIGS. 3A to 3F illustrate a method for fabricating the MTJ cell in accordance with the first embodiment of the present invention.

Figure 1:
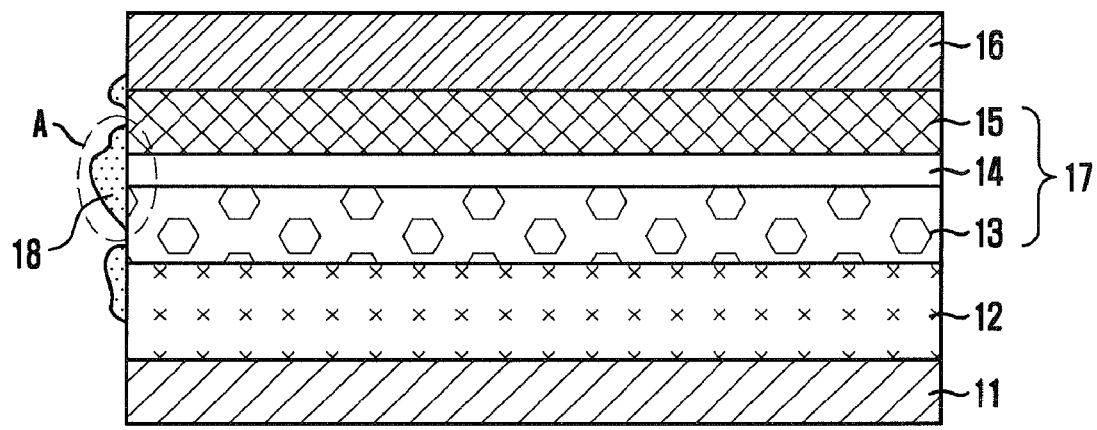
FIG. 1 illustrates a cross-sectional view of a typical MTJ cell on which an etch byproduct is deposited.
Figure 2:
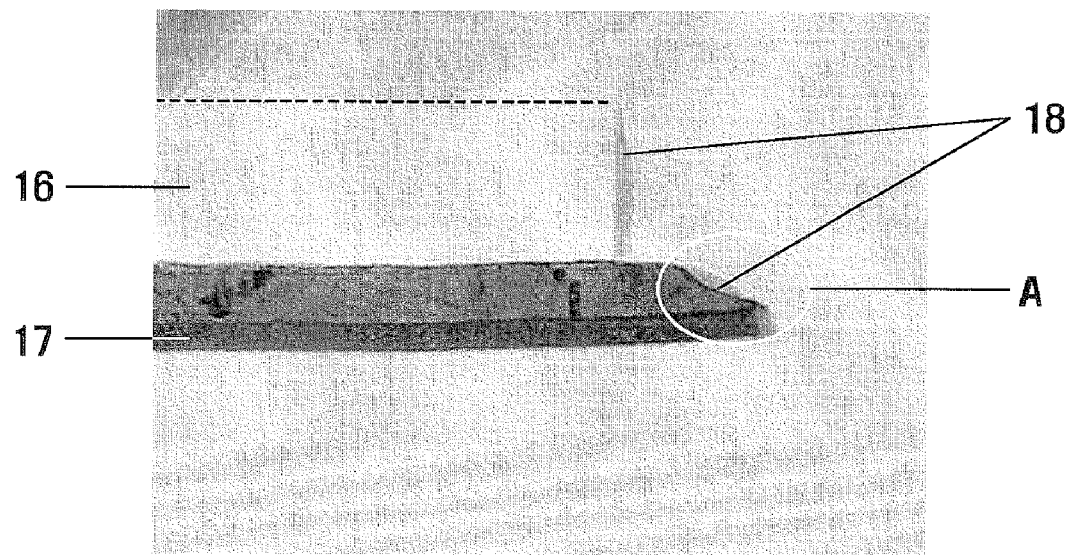
FIG. 2 illustrates a micrographic view of a typical MTJ cell on which an etch byproduct is deposited.
Figure 3A:
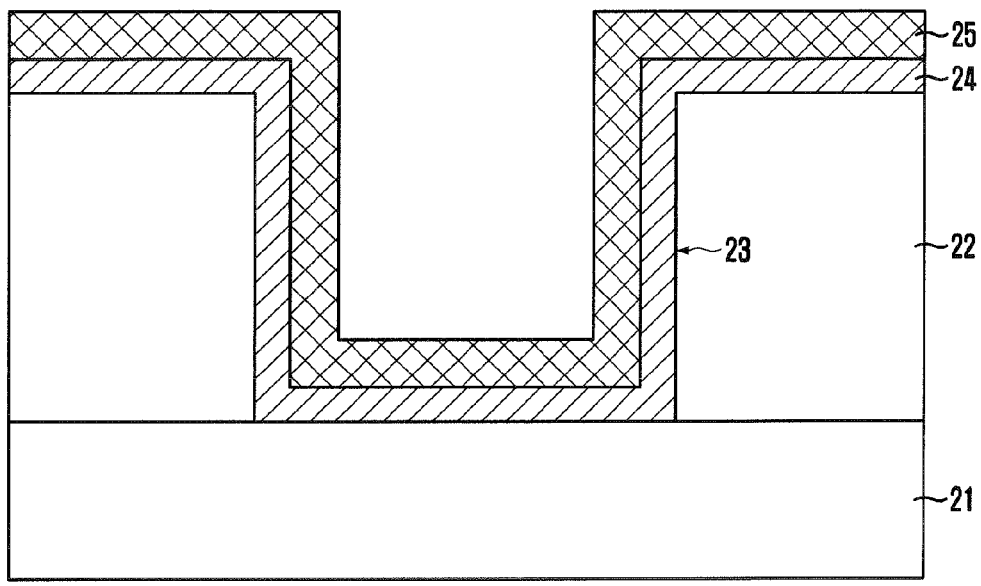

Referring to FIG. 3A, an insulation layer 22 is formed over a bottom layer 21 where a predetermined bottom structure is formed. The insulation layer 22 is etched selectively to form an opening 23.

A first electrode 24 and an anti-ferromagnetic layer 25 are sequentially formed over the opening 23. The first electrode 24 may be formed of tantalum (Ta) to a thickness of approximately 400 Å to approximately 600 Å.

The anti-ferromagnetic layer 25 is configured to fix a magnetization direction of a first ferromagnetic layer which will be formed in a subsequent process. The anti-ferromagnetic layer 25 may be formed of a metal compound, such as platinum manganese (PtMn) and iridium manganese (IrMn). The anti-ferromagnetic layer 25 may be formed to a thickness of approximately 100 Å to approximately 300 Å.

Figure 3B:
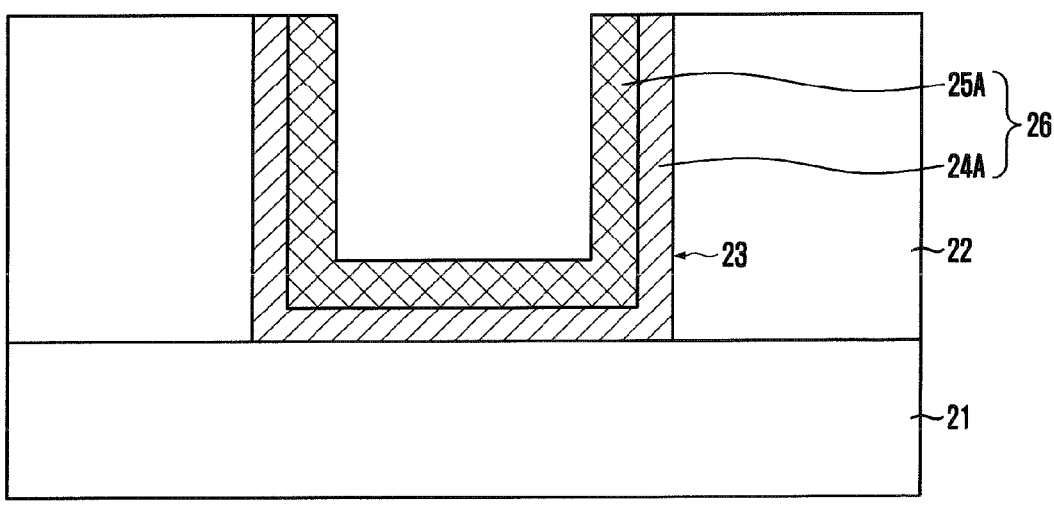

Referring to FIG. 3B, a first pattern 26 is formed, which includes portions of the first electrode 24 and the anti-ferromagnetic layer 25 which covers a bottom surface and sidewall of the opening 23. That is, the anti-ferromagnetic layer 25 and the first electrode 24 are etched selectively to expose a top surface of the insulation layer 22, thereby forming the first pattern 26 including the first electrode pattern 24A and the anti-ferromagnetic pattern 25A.

Here, the anti-ferromagnetic layer 25 and the first electrode 24 may be etched using one of chemical mechanical polishing (CMP) process and etch-back process. For example, it is possible to etch the anti-ferromagnetic layer 25 through the CMP process and then the first electrode 24 using the etch-back process.

The etch-back process may be performed using an etching gas selected from the group consisting of chlorine ($Cl_2$) gas, hydrogen bromide (HBr) gas, methanol ($CH_3OH$) gas, carbon monoxide (CO) gas, and a combination thereof. An inert gas such as argon (Ar) gas may also be added to the etching gas.

In order to prevent damage to the first electrode pattern 24A and the anti-ferromagnetic pattern 25A in the opening during the forming of the first pattern 26, the opening 23 may be filled with a sacrificial layer (not shown) such as a photoresist before the forming of the first pattern 26. In this case, the sacrificial layer can be removed after the forming of the first pattern 26.

Figure 3C:
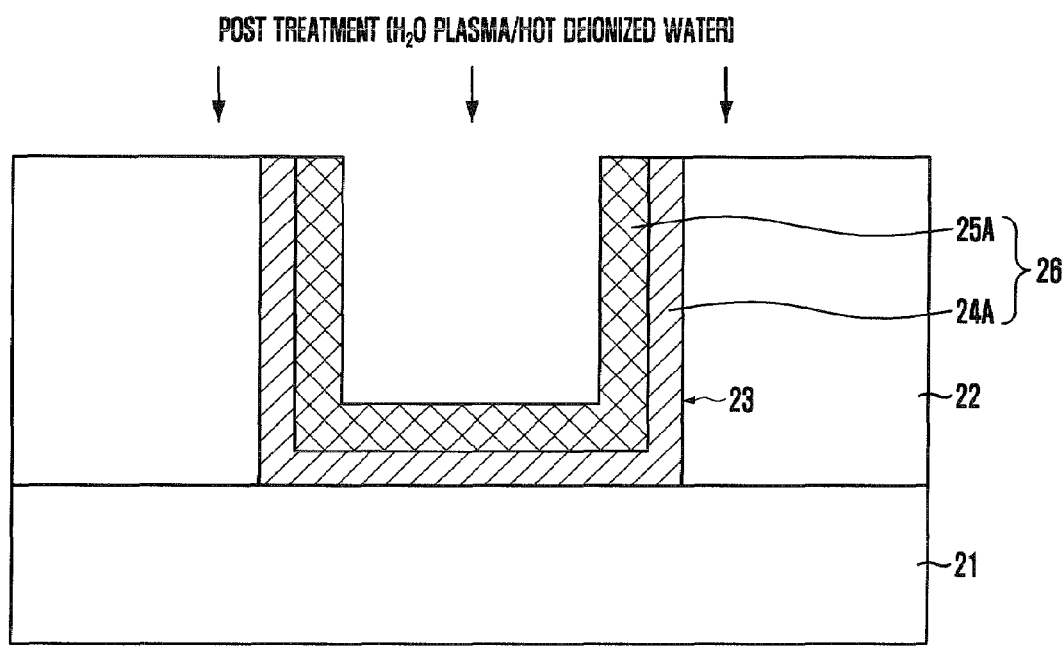

Referring to FIG. 3C, a post treatment is performed to remove a conductive etch byproduct produced during the forming of the first pattern 26. The post treatment may be performed by a $H_2O$ plasma treatment followed by a hot deionized water treatment. The post treatment may be performed at a temperature of approximately 100° C. to approximately 500° C.

Figure 3D:
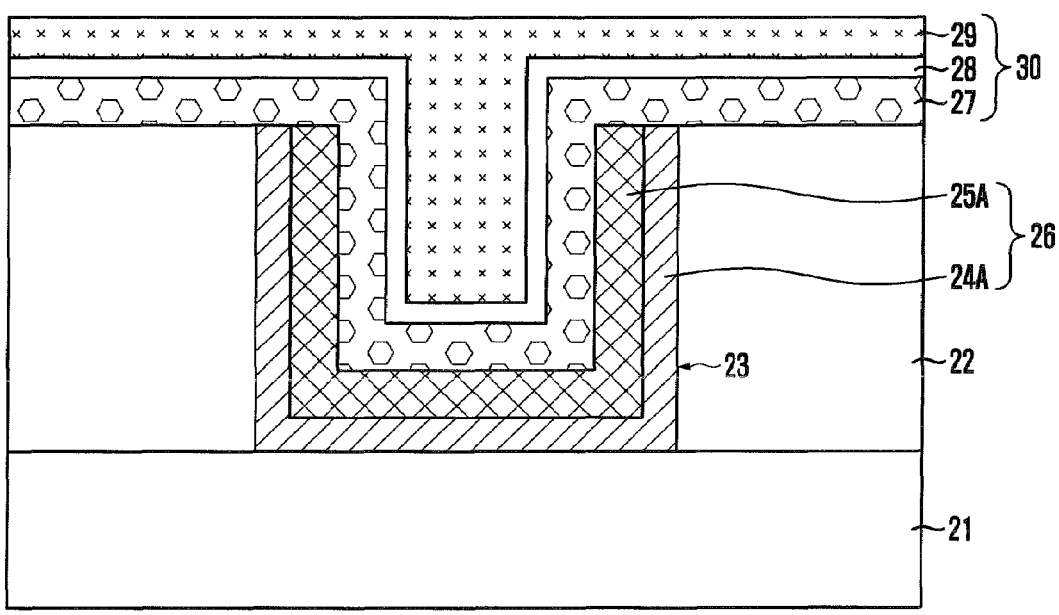

Referring to FIG. 3D, an MTJ layer 30 is formed over the insulation layer 22 and the first pattern 26 to fill the opening 23 and cover the insulation layer 22. The MTJ layer 30 may be multiple layers of a first ferromagnetic layer 27, an insulation layer 28, and a second ferromagnetic layer 29. Here, the first ferromagnetic layer 27 is fixed in a magnetization direction due to the ferromagnetic pattern 25A, whereas the second ferromagnetic layer 29 is not fixed in a magnetization direction.

The first ferromagnetic layer 27 and the second ferromagnetic layer 29 each may be a single layer formed of a ferromagnetic metal compound such as ferro-nickel (NiFe) and ferro-cobalt (CoFe). The first ferromagnetic layer 27 and the second ferromagnetic layer 29 each may also be multiple layers such as CoFe/Ru/CoFe where a ruthenium (Ru) is layered between ferro-cobalts (CoFe), and NiFe/Ru/NiFe where a ruthenium (Ru) is layered between ferro-nickels (NiFe). The first ferromagnetic layer 27 and the second ferromagnetic layer 29 each may be formed to a thickness of approximately 40 Å to approximately 80 Å.

The insulation layer 28 functions as a tunneling barrier between the first ferromagnetic layer 27 and the second ferromagnetic layer 29. The insulation layer 28 may be formed of magnesium oxide (MgO) or aluminum oxide ($Al_2O_3$) to a thickness of approximately 10 Å to approximately 20 Å.

Referring to FIG. 3E, a second electrode 31 having a line width greater than a width of the opening 23 is formed over the MTJ layer 30.

In more detail, a conductive layer for the second electrode is formed over the MTJ layer 30, and a photoresist pattern 32 is formed over the conductive layer for the second electrode. Here, the conductive layer for the second electrode may be formed of titanium nitride (TiN).

The conductive layer for the second electrode is etched using the photoresist pattern 32 as an etch barrier to form the second electrode 31. After that, the photoresist pattern 32 is removed through a strip process. This is because the subsequent etching of the MTJ layer 30 is performed at a high temperature, for example, approximately 100° C. to approximately 500° C. to remove the conductive etch byproduct easily and improve etching speed. Because of the high temperature, the residual photoresist pattern 32 may be lost during the etching to contaminate the MTJ cell. Therefore, the photoresist pattern 32 may be removed after the forming of the second electrode 31.

The reason for performing the etching of the MTJ layer 30 at the high temperature of approximately 100° C. to approximately 500° C. will be described later.

The MTJ layer 30 is etched using the second electrode 31 as an etch barrier to form an MTJ pattern 30A. That is, the second ferromagnetic layer 29, the insulation layer 28 and the first ferromagnetic layer 27 constituting the MTJ layer 30 are sequentially etched to form a second ferromagnetic pattern 29A, an insulation pattern 28A and a first ferromagnetic pattern 27A constituting the MTJ pattern 30A, respectively.

The etching for forming the MTJ pattern 30A may be performed by dry etching using an inert gas such as argon (Ar) gas, and an etching gas selected from the group consisting of chlorine ($Cl_2$) gas, hydrogen bromide (HBr) gas, methanol ($CH_3OH$) gas, carbon monoxide (CO) gas, and a combination thereof. The etching gas can be a mixed gas including methanol ($CH_3OH$) gas or carbon monoxide (CO) gas. The gas-mixture of methanol ($CH_3OH$) gas or carbon monoxide (CO) gas can improve the etching speed and reduce the redeposition of the etch byproduct produced during the forming of the MTJ pattern 30A on a surface of the MTJ pattern 30A.

Specifically, when methanol ($CH_3OH$) gas is used as the etching gas in the etching for forming the MTJ pattern 30A, an etch byproduct is produced, which has a structure (such as $Fe(CO)_x$ where x is a natural number) resulting from the combination of the methanol ($CH_3OH$) gas and a metal compound, e.g., ferro-nickel (NiFe) or ferro-cobalt (CoFe), of the first and second ferromagnetic patterns 27A and 29A. Such an etch byproduct has volatility higher than that of an etch byproduct having a structure (such as $Fe(Cl)_x$ where x is a natural number) resulting from the combination of chlorine (Cl) or bromine (Br) and the metal compound. Accordingly, when a mixed gas including methanol ($CH_3OH$) gas or carbon monoxide (CO) gas is used as the etching gas to etch the metal compound of the first and second ferromagnetic layers 27A and 29A, an etch byproduct of high volatility is produced. As such, the etching speed can be improved, and the redeposition of the etch byproduct on the sidewall of the MTJ pattern 30A can be reduced.

In addition, the etching for forming the MTJ pattern 30A may be performed at a high temperature, for example, approximately 100° C. to approximately 500° C. This is because the boiling temperature of the metal compound, such as ferro-nickel (NiFe) and ferro-cobalt (CoFe), constituting the first and second ferromagnetic patterns 27A and 29A is extremely high, i.e., above 1,000° C. As well known, an etch byproduct produced from a material of high boiling temperature has low volatility. Accordingly, by performing the etching at the high temperature of approximately 100° C. to approximately 500° C., the volatility of the etch byproduct can be increased further.

Referring to FIG. 3F, a post treatment is performed to remove the etch byproduct produced during the forming of the MTJ pattern 30A. The post treatment may be performed by a H$_2$O plasma treatment followed by a hot deionized water treatment. The post treatment may be performed at a temperature of approximately 100° C. to approximately 500° C.

Through the post treatment, it is possible to remove the conductive etch byproduct produced during the etching for forming the MTJ pattern 30A and prevent it from being redeposited on the MTJ pattern 30A. In addition, it is also possible to prevent oxidation and corrosion of a metal element, such as iron (Fe), of a metal compound constituting the first and second ferromagnetic patterns 27A and 29A. Here, the oxidation and the corrosion of the metal element such as iron (Fe) result from the combination of the metal element with a halogen gas, such as chlorine (Cl) gas and bromine (Br) gas, of the etching gas used during the etching for forming the MTJ pattern 30A. Accordingly, by removing the chlorine (Cl) or the bromine (Br) combined with the metal element after converting it to hydrogen chloride (HCl) gas or hydrogen bromide (HBr) gas, it is possible to prevent the oxidation and the corrosion of the metal element of the metal compound constituting the first and second ferromagnetic layers 27A and 29A.

The oxidation and the corrosion of the metal element of the metal compound constituting the first and second ferromagnetic layers 27A and 29A due to an operational error may decrease a magnetoresistance R$_{ms}$ of the MTJ cell, causing a malfunction of a semiconductor device, such as an MRAM device, utilizing the MTJ cell. Accordingly, the post treatment is performed to prevent this.

Through the above described procedures, the MTJ cell in accordance with the first embodiment of the present invention can be formed.

As described above, by etching the anti-ferromagnetic layer 25 before the forming of the MTJ layer 30, it is possible to prevent the deterioration of the electric property of the MTJ cell due to the conductive etch byproduct produced during the etching of the anti-ferromagnetic layer 25.

In addition, by performing the post treatment after the forming of the first pattern 26 and the MTJ pattern 30A, it is possible to remove the conductive etch byproduct and prevent the oxidation and the corrosion of the metal element of the metal compound constituting the first and second ferromagnetic patterns 27A and 29A, and thus to improve electric property of the MTJ cell.

As such, it is possible to improve reliability and fabricating yield of the semiconductor device utilizing the MTJ cell.

Hereinafter, a method for fabricating an MTJ cell in accordance with a second embodiment of the present invention will be described. The second embodiment is primarily focused on forming a capping layer over an MTJ layer to provide the MTJ cell with a improved property than the MTJ cell in accordance with the above described first embodiment of the invention. Detailed descriptions of the features of the second embodiment which are similar to those of the first embodiment will be omitted.

Figure 4A:
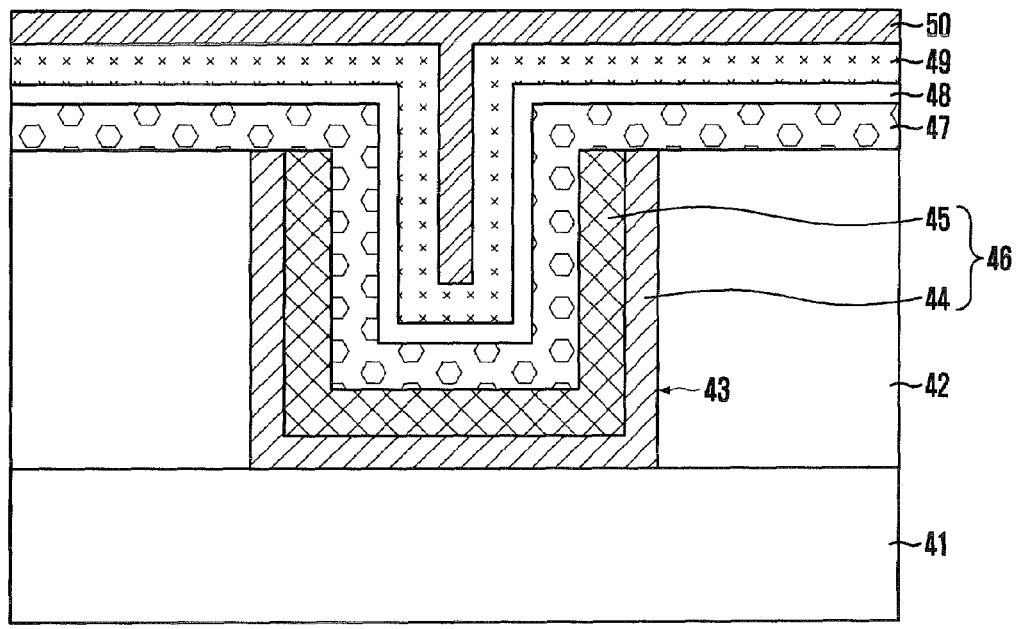
FIGS. 4A and 4B illustrate a method for fabricating an MTJ cell in accordance with a second embodiment of the present invention.
Figure 4B:
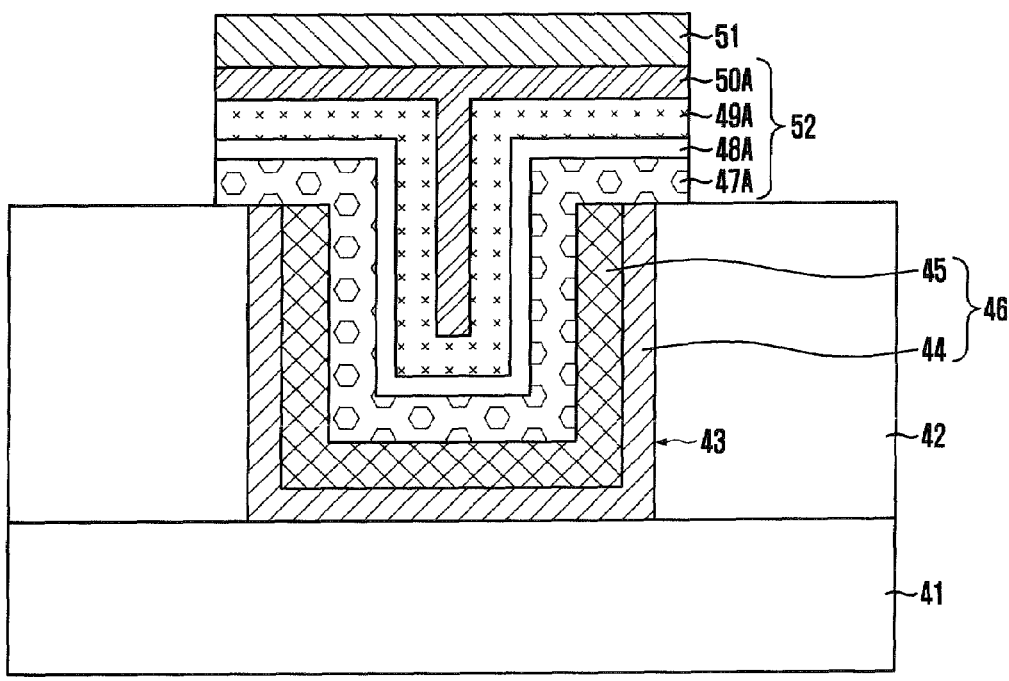

FIGS. 4A and 4B illustrate the method for fabricating the MTJ cell in accordance with the second embodiment of the present invention.

Referring to FIG. 4A, an insulation layer 42 is formed over a bottom layer 41 where a predetermined bottom structure is formed. The insulation layer 42 is etched selectively to form an opening 43.

Then, a first pattern 46 is formed, which includes a first electrode 44 on a bottom surface and a sidewall of the opening 43, and an anti-ferromagnetic layer 45 over the first electrode 44. The procedure for forming the first pattern 46 is similar to that described above with reference to FIG. 3B.

A post treatment is performed to remove a conductive etch byproduct produced during the forming of the first pattern 46. The post treatment may be performed using the same procedure as described above with reference to FIG. 3C.

An MTJ layer is formed over the first pattern 46 and the insulation layer 42 to a predetermined thickness. The MTJ layer includes a first ferromagnetic layer 47, an insulation layer 48 and a second ferromagnetic layer 49 that are sequentially formed. Here, the first ferromagnetic layer 47 is fixed in a magnetization direction by the anti-ferromagnetic layer 45, whereas the second ferromagnetic layer 49 is not fixed in a magnetization direction.

A capping layer 50 is formed over the MTJ layer to fill the opening 43. The capping layer 50 may be formed of tantalum (Ta) or tantalum nitride (TaN) to prevent oxidation and corrosion of the second ferromagnetic layer 49. The oxidation and the corrosion of a metal element of a metal compound constituting the second ferromagnetic layer 49 due to an operational error may decrease a magnetoresistance R$_{ms}$ of the MTJ cell, causing a malfunction of a semiconductor device, such as an MRAM, utilizing the MTJ cell. Therefore, the capping layer 50 is formed to prevent this.

The magnetoresistance R$_{ms}$ is defined as percentage ratio of the resistance difference between the MTJ cell in a high resistance state and that in a low resistance state to the resistance of the MTJ cell in the low resistance state. As the magnetoresistance R$_{ms}$ is decreased, the resistance difference between the MTJ cell in the high resistance state and in the low resistance state may be reduced, thereby reducing the data storage characteristic of the MRAM device utilizing the MTJ cell.

Referring to FIG. 4B, a second electrode 51 having a line width greater than a width of the opening 43 is formed over the capping layer 50. The capping layer 50, the second ferromagnetic layer 49, the insulation layer 48 and the first ferromagnetic layer 47 are sequentially etched using the second electrode as an etch barrier to form an MTJ pattern 52. Here, the etching for forming the MTJ pattern 52 may be performed by the same procedure as described above with reference to FIG. 3E.

That is, the capping layer 50, the second ferromagnetic layer 49, the insulation layer 48, and the first ferromagnetic layer 47 are sequentially etched to form a capping pattern 50A, a second ferromagnetic pattern 49A, an insulation pattern 48A, and a first ferromagnetic pattern 47A constituting the MTJ pattern 52, respectively.

Thereafter, a post treatment is performed to remove a conductive etch byproduct produced during the forming of the MTJ pattern 52 as well as to prevent oxidation and corrosion of the metal element of the metal compounds constituting the first and second ferromagnetic layers 47A and 49A. Here, the post treatment may be performed using the same procedure as described above with reference to FIG. 3F.

Through the above described procedures, the MTJ cell in accordance with the second embodiment of the present invention can be formed.

As described above, by etching the anti-ferromagnetic layer 45 before the forming of the first and second ferromagnetic layers 47A and 49A, it is possible to prevent the deterioration of the electric property of the MTJ cell due to the conductive etch byproduct produced during the etching of the anti-ferromagnetic layer 45.

Further, by forming the capping layer 50A on the second ferromagnetic layer 49A, it is possible to prevent the oxidation and the corrosion of the second ferromagnetic layer 49A due to the operational error, and thereby to improve the electric property of the MTJ cell.

Furthermore, by performing the post treatments after the forming of the first pattern 46 and after the forming of the MTJ pattern 52, it is possible to prevent the oxidation and the corrosion of the first and second ferromagnetic layers 47A and 49A, and thereby to improve the electric property of the MTJ cell.

As such, it is possible to improve reliability and fabricating yield of the semiconductor device utilizing the MTJ cell.

In summary, by etching the anti-ferromagnetic layer before the forming of the MTJ layer, it is possible to prevent the deterioration of the electric property of the MTJ cell due to an etch byproduct produced during the etching of the anti-ferromagnetic layer.

As such, it is possible to improve reliability and fabricating yield of the semiconductor device utilizing the MTJ cell.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a magnetic tunnel junction cell, the method comprising:
    forming an insulation layer having an opening;
    forming a first pattern including multiple layers of a first electrode pattern on a bottom surface and a sidewall of the opening and an anti-ferromagnetic pattern over the first electrode pattern;
    forming a magnetic tunnel junction layer over the first pattern and the insulation layer;
    forming a second electrode over the magnetic tunnel junction layer, the second electrode having a line width greater than a width of the opening; and
    etching the magnetic tunnel junction layer using the second electrode as an etch barrier.

2. The method of claim 1, wherein the magnetic tunnel junction layer is formed over the first pattern and the insulation layer to fill the opening.

3. The method of claim 1, further comprising forming a capping layer over the magnetic tunnel junction layer to fill the opening,
    wherein the magnetic tunnel junction layer is formed over the first pattern and the insulation layer to a predetermined thickness.

4. The method of claim 1, wherein forming the first pattern comprises:
    forming a first electrode and an anti-ferromagnetic layer over the insulation layer having the opening, the first electrode having multiple layers; and
    selectively etching the multiple layers so that the multiple layers remain only in the opening.

5. The method of claim 4, wherein selectively etching the multiple layers is performed by a chemical mechanical polishing (CMP) process or an etch-back process, or both.

6. The method of claim 5, wherein the etch-back process is performed using a gas selected from the group consisting of methanol ($CH_3OH$) gas, carbon monoxide (CO) gas, chlorine ($Cl_2$) gas, hydrogen bromide (HBr) gas and a combination thereof.

7. The method of claim 4, further comprising forming a sacrificial layer to fill the opening before selectively etching of the multiple layers.

8. The method of claim 1, wherein etching the magnetic tunnel junction layer is performed using a gas selected from the group consisting of $CH_3OH$ gas, CO gas, $Cl_2$ gas, HBr gas and a combination thereof.

9. The method of claim 1, wherein etching the magnetic tunnel junction layer is performed at a temperature of approximately 100° C. to approximately 500° C.

10. The method of claim 1, further comprising:
    performing a post treatment after forming the first pattern; and
    performing the post treatment after etching the magnetic tunnel junction layer.

11. The method of claim 10, wherein the post treatment comprises a $H_2O$ plasma treatment and a hot deionized water treatment.

12. The method of claim 10, wherein the post treatment is performed at a temperature of approximately 100° C. to approximately 500° C.

13. The method of claim 1, wherein the magnetic tunnel junction layer comprises multiple layers of a first ferromagnetic layer, an insulation layer and a second ferromagnetic layer.

* * * * *